United States Patent
Iwamoto et al.

(10) Patent No.: US 7,259,500 B2
(45) Date of Patent: Aug. 21, 2007

(54) PIEZOELECTRIC DEVICE

(75) Inventors: Takashi Iwamoto, Kusatsu (JP); Yoshihiro Koshido, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 18 days.

(21) Appl. No.: 10/564,220

(22) PCT Filed: Jun. 17, 2005

(86) PCT No.: PCT/JP2005/011169

§ 371 (c)(1),
(2), (4) Date: Jan. 11, 2006

(87) PCT Pub. No.: WO2006/006343

PCT Pub. Date: Jan. 19, 2006

(65) Prior Publication Data

US 2006/0192462 A1    Aug. 31, 2006

(30) Foreign Application Priority Data

Jul. 14, 2004    (JP)    ............................. 2004-207896

(51) Int. Cl.
*H01L 41/08* (2006.01)
(52) U.S. Cl. ........................ 310/340; 310/344
(58) Field of Classification Search ................ 310/340, 310/344, 348
See application file for complete search history.

(56) References Cited

U.S. PATENT DOCUMENTS

| | | | | |
|---|---|---|---|---|
| 5,376,860 | A * | 12/1994 | Sato | ............ 310/346 |
| 5,545,849 | A * | 8/1996 | Kondo | ........... 174/559 |
| 6,181,015 | B1 | 1/2001 | Gotoh et al. | |
| 6,417,026 | B2 | 7/2002 | Gotoh et al. | |
| 6,972,518 | B2 * | 12/2005 | Heimgartner et al. | ....... 313/512 |
| 7,018,866 | B2 * | 3/2006 | Sugaya et al. | ............ 438/108 |
| 7,061,098 | B2 * | 6/2006 | Meckes et al. | ............ 257/704 |
| 7,205,705 | B2 * | 4/2007 | Iwamoto | ..................... 310/340 |
| 2001/0001293 | A1 | 5/2001 | Gotoh et al. | |

(Continued)

FOREIGN PATENT DOCUMENTS

JP        08-213874        8/1996

(Continued)

OTHER PUBLICATIONS

International Search Report for PCT Application No. PCT/JP2005/011169 mailed Sep. 20, 2005.

*Primary Examiner*—Thomas M. Dougherty
(74) *Attorney, Agent, or Firm*—Keating & Bennett, LLP (57) ABSTRACT

A piezoelectric device includes an element substrate having a piezoelectric element and an electrically conductive pattern connected to the piezoelectric element, a supporting layer arranged within the periphery of the piezoelectric element, a cover extending so as to provide a groove inside the external periphery of the element substrate, the groove ranging over the entire external periphery of the element substrate by removing a portion of the cover and/or supporting layer inside the external periphery of the element substrate after the cover is arranged on the supporting layer, an insulating reinforcing material that entirely covers portions of the element substrate ranging from the cover to the periphery of a principal surface of the element substrate, and an electrically conductive member electrically connected to the electrically conductive pattern so as to pass through the cover and the reinforcing material.

3 Claims, 5 Drawing Sheets

U.S. PATENT DOCUMENTS

| | | |
|---|---|---|
| 2002/0101304 A1 | 8/2002 | Onishi et al. |
| 2004/0125970 A1* | 7/2004 | Kawakubo ................. 381/190 |
| 2004/0174090 A1 | 9/2004 | Koshido |

FOREIGN PATENT DOCUMENTS

| | | | |
|---|---|---|---|
| JP | 11-251866 | 9/1999 | |
| JP | 2000-261284 | 9/2000 | |
| JP | 2002-261582 | 9/2002 | |
| JP | 2003-264442 | 9/2003 | |
| JP | 2003-297962 | 10/2003 | |
| JP | 2004-129224 | 4/2004 | |
| JP | 2004-153412 | 5/2004 | |
| JP | 2004-288711 | * 10/2004 | |

* cited by examiner

PIEZOELECTRIC DEVICE

BACKGROUND OF THE INVENTION

1. Field of the Invention

The present invention relates to piezoelectric devices, and in particular relates to a piezoelectric device having piezoelectric elements using a piezoelectric substrate and a piezoelectric thin film, such as a resonator and a filter.

2. Description of the Related Art

Recently, a chip-size package (CSP) has been developed in which a piezoelectric device, such as a surface acoustic wave filter (SAW filter) including a piezoelectric substrate and a bulk-acoustic-wave filter (BAW filter) including a piezoelectric thin film, is miniaturized to an element chip size.

Figure 5:
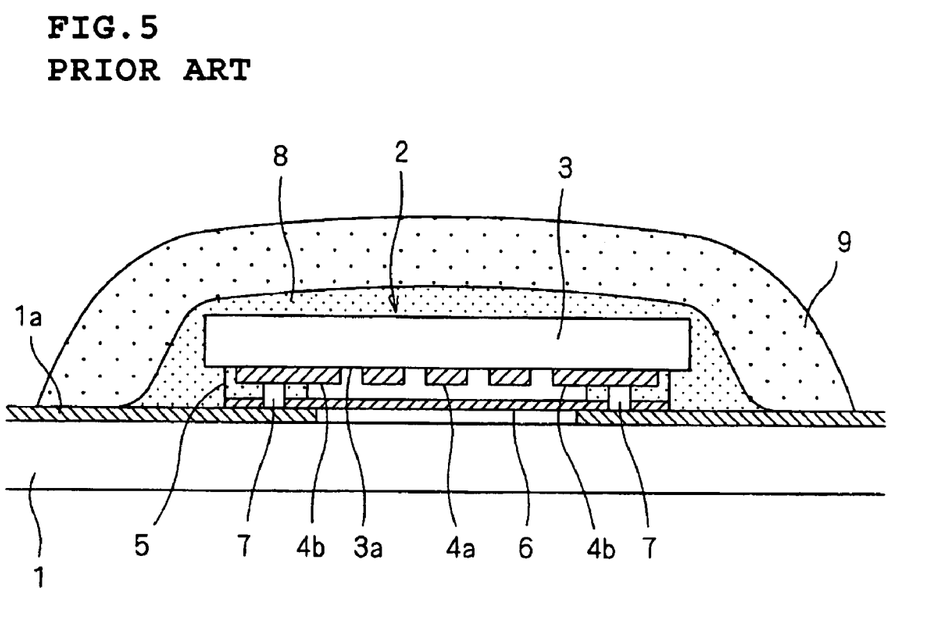
FIG. 5 is a sectional view of a conventional surface acoustic wave filter.

For example, a piezoelectric device 2 shown in FIG. 5 includes a piezoelectric substrate 3 having piezoelectric elements including IDTs (interdigital transducers, interdigital electrodes) 4a and an electrically conductive pattern, such as pads 4b, provided on one principal surface 3a of the piezoelectric substrate 3, a cover 6 covering the one principal surface 3a with a support layer 5 therebetween, and external electrodes 7 which are exposed outside the cover 6. The piezoelectric device 2 is mounted in a face down orientation at a predetermined position of a wiring pattern 1a of a circuit board 1 (see Japanese Unexamined Patent Application Publication No. H11-251866, for example).

The piezoelectric device 2 disclosed in Japanese Unexamined Patent Application Publication No. H11-251866 electrically connects the external electrodes 7 to the pads 4b by forming holes in the cover 6 so as to be embedded with the external electrodes 7 by electrolytic plating or evaporation. Accordingly, since the vibratory space around the IDT 4a cannot be sufficiently sealed, it has been necessary to seal the piezoelectric device 2 by covering it with a reinforcing resin 9 with a buffer resin 8 therebetween after mounting the piezoelectric device 2 on the circuit board 1.

SUMMARY OF THE INVENTION

In order to overcome the problems described above, preferred embodiments of the present invention provide a piezoelectric device capable of improving moisture resistance while being miniaturized, which need not be sealed after being mounted on a circuit board, and a method of manufacturing such a piezoelectric device.

A first preferred embodiment of the present invention provides a piezoelectric device including a) an element substrate having a piezoelectric element and an electrically conductive pattern connected to the piezoelectric element provided on a principal surface, b) a supporting layer arranged at the periphery of the piezoelectric element on the principal surface of the element substrate, c) a cover extending so as to provide a groove inside the external periphery of the element substrate, the groove ranging over the entire external periphery of the element substrate by removing a portion of the cover layer and/or supporting layer inside the external periphery of the element substrate viewed from the normal direction of the principal surface of the element substrate after the cover is arranged on the supporting layer, d) an insulating reinforcing material that entirely covers portions of the element substrate adjacent to the cover ranging from the cover to the periphery of the principal surface of the element substrate, and e) an electrically conductive member electrically connected to the electrically conductive pattern so as to pass through the cover and the reinforcing material.

In the configuration described above, the piezoelectric element opposes the cover with an intervening supporting layer therebetween and a space is provided around the piezoelectric element, so that the piezoelectric element freely vibrates. Since the piezoelectric element can be sealed with the reinforcing material, the piezoelectric device has significantly improved moisture resistance, and need not be sealed with a resin after being mounted on a circuit board.

Preferably, the cover extends to the outside of the supporting layer from its periphery viewed from the normal direction of the principal surface of the element substrate.

In the configuration described above, the cover member, which is larger than the supporting layer, is arranged on the supporting layer, and by removing the outside of the supporting layer, only the cover member is removed without removing the supporting layer so as to provide the cover with the removed cover member. The removing workload can be thereby reduced to be as small as possible so as to increase the processing speed. Also, the contact area between the cover and the reinforcing material can be increased, improving the sealing ability.

Preferably, the cover or the supporting layer is made of one of a polyimide resin, a benzocyclobutene resin, and a silicone resin while the reinforcing material is an epoxy resin or a silicone resin, for example. Other suitable materials may also be used for the cover and the supporting layer.

If a halogen gas is generated during the curing of the resins, characteristic deterioration is caused due to the corrosion of the piezoelectric element or the element substrate and gas adhesion to the surface of the piezoelectric element. With the above-described configuration, such a problem can be prevented by using resins which do not generate a halogen gas.

In order to solve the problems described above, another preferred embodiment of the present invention provides a method of manufacturing a piezoelectric device constructed as follows.

A method for simultaneously manufacturing a plurality of piezoelectric devices includes the steps of a) a first step of arranging a cover on a supporting layer while providing a first electrically conductive member penetrating the cover to be connected to an electrically conductive pattern, on an element substrate having a piezoelectric element and the electrically conductive pattern connected to the piezoelectric element, which are provided on a principal surface, and the supporting layer provided around the piezoelectric element, b) a second step of removing portions ranging from the cover to the element substrate, at least inside the external periphery of the element substrate, by a laser beam so as to provide a groove inside the external periphery of the element substrate for a piezoelectric device viewed from the normal direction of the principal surface of the element substrate, the groove extending over the entire external periphery of the element substrate, and c) a third step of arranging an insulating reinforcing material on the element substrate and the cover so as to entirely cover portions of the element substrate adjacent to the cover ranging from the cover to the element substrate while providing a second electrically conductive member penetrating the reinforcing material to be connected to the first electrically conductive member.

The piezoelectric element opposes the cover with an intervening supporting layer therebetween and a space is provided around the piezoelectric element, so that the piezoelectric element freely vibrates. Since the piezoelectric element can be sealed with the reinforcing material, the piezoelectric device has sufficiently improved moisture resistance, and need not be covered with a resin after being mounted on a circuit board.

When the cover is removed by a laser, if there is no supporting layer arranged along the boundary between the piezoelectric devices, only the cover is removed, or if the supporting layer exists, it is also removed.

When the external electrodes are provided adjacent to the reinforcing material, through holes are provided in the cover in order to route wiring for electrically connecting the electrically conductive pattern of the element substrate and the external electrodes. By the laser used for forming the through holes, the cover may also be removed.

Preferably, the wavelength of the laser beam is about 355 nm or less, for example.

The laser beam with this wavelength removes resins but does not remove metals. Hence, when an electrically conductive pattern, such as a metallic power feeding line, is provided on the element substrate along the boundary between the piezoelectric devices, only the cover is removed while the metallic power feeding line is left so as to be used for power feeding during electrolytic plating and pyroelectric grounding of the element substrate after removing the cover.

Preferably, the method further includes a step, performed between the first and second steps, of removing the electrically conductive pattern provided on the principal surface of the element substrate along the boundary between the piezoelectric devices, wherein each device is a single piezoelectric device.

In this case, there is no electrically conductive pattern between the element substrate and the reinforcing material, so that the device can have the greatly improved moisture resistance.

The electrically conductive pattern provided along the boundary between piezoelectric devices can be used for the power feeding line of the electrolytic plating, however it cannot be used after the pattern is removed, so that it is difficult to form the external electrode by the electrolytic plating. In this case, the pattern is formed by electroless plating. Alternatively, before arranging the reinforcing material, a metallic column may be provided on the cover as a second electrically conductive member so as to electrically connect to the first electrically conductive member, so that the metallic column may be exposed from the reinforcing material after the reinforcing material is arranged.

Preferably, the third step includes curing the reinforcing material arranged on the element substrate and the cover in a reduced pressure atmosphere.

Even if the curing gas generated during the curing of the reinforcing material contains an adverse effective ingredient, such as halogen gas, which causes a characteristic deterioration, the ingredient can be prevented from entering the sealed space enclosing the piezoelectric elements, thereby preventing the characteristic deterioration due to the adverse effective ingredient contained in the curing gas.

A piezoelectric device according to a preferred embodiment of the present invention achieves greatly improved moisture resistance while being miniaturized, and need not be sealed after being mounted on a circuit board. According to a method of manufacturing a piezoelectric device of a preferred embodiment of the present invention, the device has a greatly improved moisture resistance while being miniaturized, so that a surface acoustic wave device can be manufactured, which need not be sealed after being mounted on a circuit board.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be described below with reference FIGS. 1 to 4.

Figure 1:
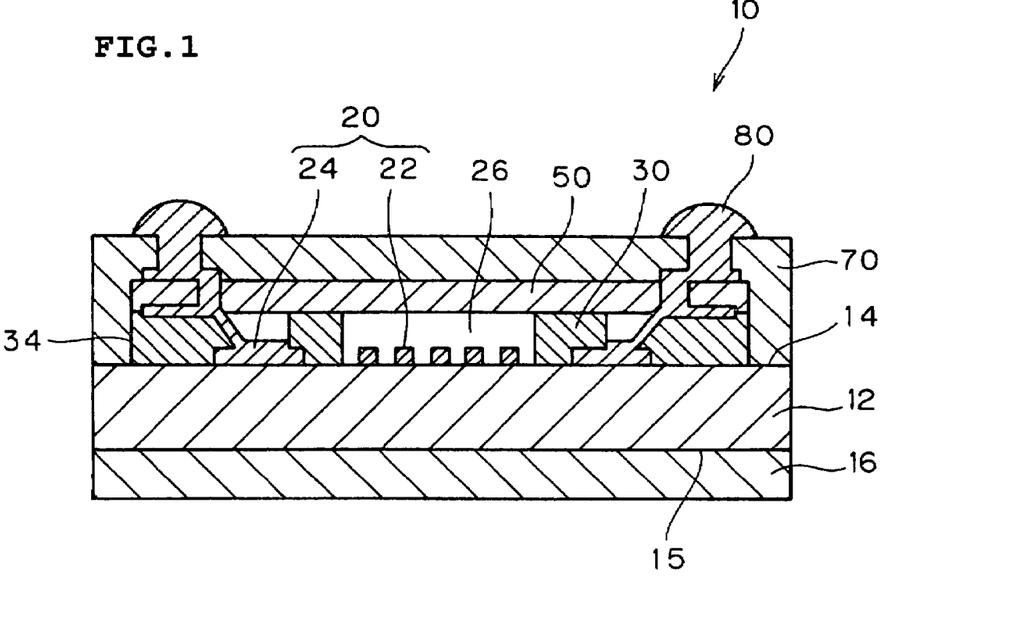
FIG. 1 is a sectional view of a first preferred embodiment of a surface acoustic wave filter.

As shown in the sectional view of FIG. 1, a surface acoustic wave filter 10 includes a piezoelectric substrate 12 having piezoelectric elements including IDTs 22 and an electrically conductive pattern including pads 24 preferably formed of metallic films 20 on one principal upper surface 14 of the piezoelectric substrate 12. On the upper surface 14, a cover 50 is arranged with an intervening supporting layer 30 therebetween so as to provide a vibratory space 26 around the IDTs 22. The supporting layer 30 is provided around the IDTs 24, and surface acoustic waves freely propagate through the supporting layer 30 adjacent to the vibratory space 26 of the piezoelectric substrate 12. Furthermore, an insulating reinforcing material 70 entirely covers the portion from the cover 50 to the periphery of the upper surface 14. From the reinforcing material 70, external electrodes 80 are exposed, so that the surface acoustic wave filter 10 can be mounted on a circuit board of an electric instrument. On the other principal surface 15 of the piezoelectric substrate 12 (bottom side in the drawing), a protection resin 16 is arranged.

The cover 50 extends to the peripheral surface 34 of the supporting layer 30 so as to cover the supporting layer 30, and it may also extend toward the outside of the peripheral face 34. As will be described in detail, through holes are provided in the cover 50 and the reinforcing material 70 so that electrical wiring is inserted therethrough to connect the pads 24 and the external electrodes 80.

The reinforcing material 70 extends along the external periphery of the upper surface 14 of the piezoelectric substrate 12 and over the entire periphery thereof so as to seal off the upper surface 14 of the piezoelectric substrate 12. The vibratory space 26 is thereby sealed closely and shielded from the surroundings.

Figure 2:
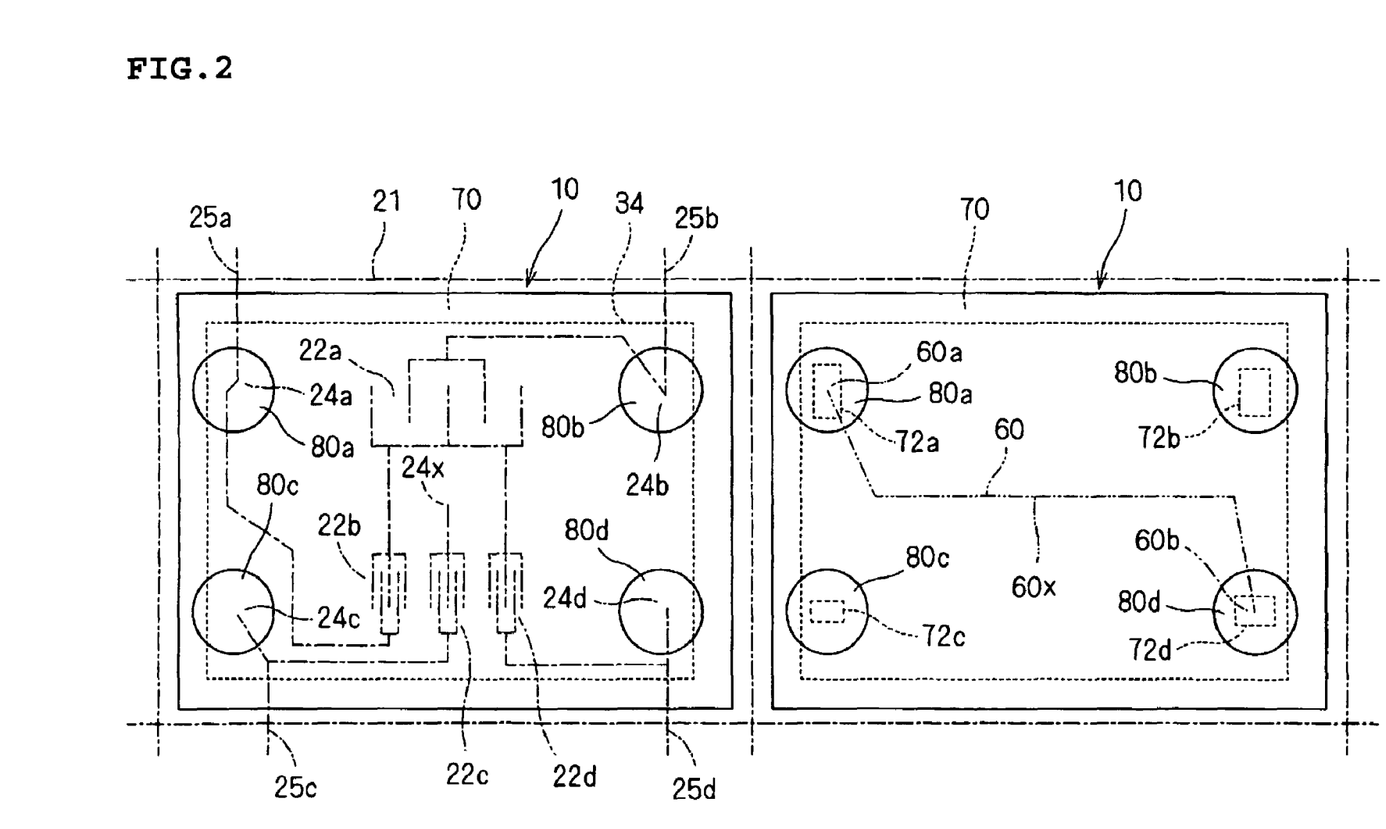
FIG. 2 is a plan view of the surface acoustic wave filter of the first preferred embodiment of the present invention.

A plurality of the surface acoustic wave filters 10 can be simultaneously manufactured, and FIG. 2 shows two surface acoustic wave filters 10 with a border line during manufacturing.

As shown in the plan view of FIG. 2, four external electrodes 80a, 80b, 80c, and 80d are provided as the external electrodes 80. The external electrodes 80a and 80d are ground terminals, the external electrode 80b is an input terminal, and the external electrode 80c is an output terminal.

On the wafer top surface of the piezoelectric substrate 12, a metallic film pattern is provided as schematically shown by dash-dot lines of FIG. 2. In addition, the metallic film pattern is not shown in the right surface acoustic wave filter 10 of FIG. 2.

Within the surface acoustic wave filter 10, four IDTs 22a, 22b, 22c, and 22d are provided as the IDT 22. Also, wiring is provided so as to connect the IDTs 22a, 22b, 22c, and 22d and the pads 24a, 24b, 24c, 24d, and 24x. On the other hand, on the border between adjacent surface acoustic wave filters 10, an electrically conductive line 21 is provided. Furthermore, short lines 25a, 25b, 25c, and 25d are provided for connecting the electrically conductive line 21 to the wiring within the surface acoustic wave filter 10. Reflectors may be provided on both sides of the IDT 22a, on the IDT 22b opposite to the IDT 22c, and on the IDT 22d opposite to the IDT 22c. The metallic pattern other than the IDTs and the reflectors is not necessarily surrounded by the supporting layer. For example, a portion of the wiring connecting the pads 24a, 24b, 24c, 24d, and 24x to the IDTs may be exposed from the supporting layer 30.

The cover 50 arranged on the supporting layer 30 is provided with below mentioned through holes (via holes) provided at positions corresponding to those of the pads 24a, 24b, 24c, 24d, and 24x. On the top surface of the cover 50, a ground wiring 60 is provided as shown by a double-dotted chain line in the right surface acoustic wave filter 10 of FIG. 2. In addition, in the left surface acoustic wave filter 10 of FIG. 2, the ground wiring 60 is not shown. Both ends 60a and 60b of the ground wiring 60 are electrically connected to the pads 24a and 24d via the via holes penetrating the cover 50 and the supporting layer 30, respectively. An intermediate point 60x of the ground wiring 60 is electrically connected to the pad 24x connected to the IDT 24x through the via holes penetrating the cover 50 and the supporting layer 30. The ground wiring 60 three-dimensionally intersects with a hot wiring connecting the IDT 22a to the IDTs 22b and 22d with the insulating supporting layer 30 and the cover 50 therebetween.

As shown in a dotted line of the right surface acoustic wave filter 10 of FIG. 2, the reinforcing material 70 is preferably provided with substantially rectangular holes 72a, 72b, 72c, and 72d, and the external electrodes 80a, 80b, 80c, and 80d are electrically connected to the pads 24a, 24b, 24c, and 24d via the holes 72a, 72b, 72c, and 72d, respectively. In addition, in the left surface acoustic wave filter 10 of FIG. 2, the substantially rectangular holes of the reinforcing material 70 are not shown.

Next, the manufacturing method of the surface acoustic wave filter 10 will be described with reference to FIG. 3.

Figures 3A, 3F:
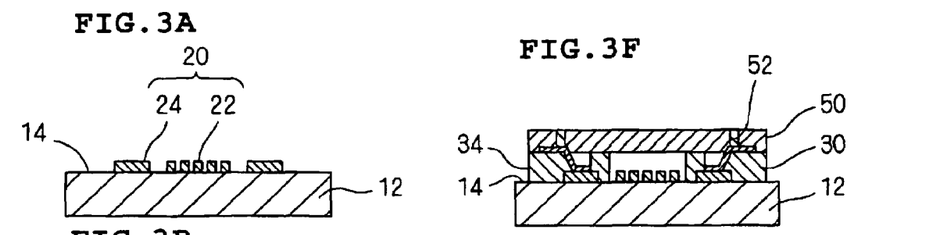
FIGS. 3A to 3J are exemplary views illustrating a manufacturing process of the surface acoustic wave filter according to the first preferred embodiment of the present invention.

As shown in FIG. 3A, on the wafer top surface 14 of the piezoelectric substrate 12, a metallic film 20 is provided. For example, on a LiTaO substrate with a thickness of about 0.3 mm and a diameter of about 100 mm, parts of the IDTs 22, the pads 24, and the electrically conductive line 21 (see FIG. 2) are formed with an Al film with a thickness of about 100 nm by a deposition lift-off technology. The line width of the electrically conductive line 21 is preferably about 20 μm, for example. Furthermore, for serving as a power feeding film during subsequent plating, portions of the pads 24 and the electrically conductive line 21 (see FIG. 2) are preferably made of Al and provided with, for example, a thickness of about 10 nm and with a thickness of about 1 μm, respectively, by a lift-off technology or other suitable process.

Figures 3B, 3G:
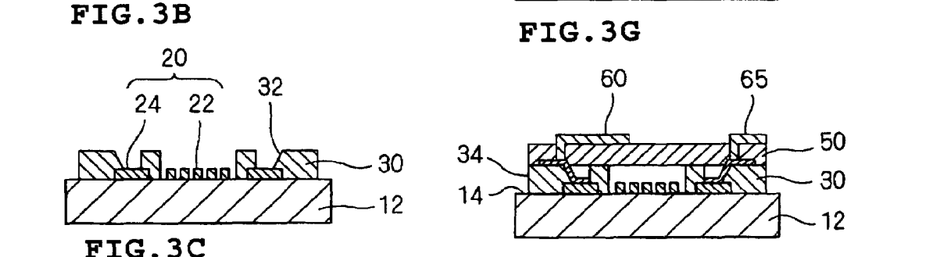

Then, as shown in FIG. 3B, on the wafer top surface 14 of the piezoelectric substrate 12, the supporting layer 30 is provided. The supporting layer 30 is provided with openings in portions corresponding to those of the IDTs 22 and the pads 24. A groove is provided between adjacent surface acoustic wave filters 10, and the opening is also provided on the electrically conductive line 21 (see FIG. 2). For example, the wafer top surface 14 of the piezoelectric substrate 12 is coated with a negative-type photosensitive polyimide having a thickness of about 20 μm, for example, and it is dried, exposed, post-exposure baked (PEB), and developed so as to form the supporting layer 30 in a pattern having openings in portions between the surface acoustic wave filters 10 and corresponding to those of the IDTs 22 and the pads 24. At this time, by using a gray tone photo mask, forward tapered inclined surfaces 32 are provided in the opening of the pads 24, facilitating forming a wiring 40 in the subsequent step.

Figures 3C, 3H:
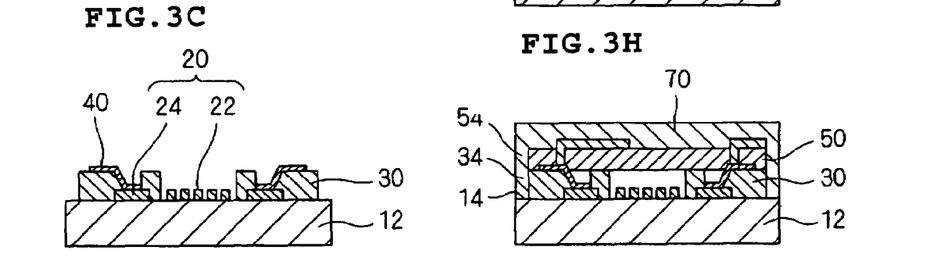

Then, as shown in FIG. 3C, wiring 40 is provided so as to extend from the pad 24 to a pad portion (having a line width of about 30 μm, for example) of the top surface of the supporting layer 30. For example, the wiring 40 is preferably made of a Cu film with a thickness of about 3 μm formed on a Ti film with a thickness of about 10 nm, in view of subsequent plating. Simultaneously, the short lines 25a to 25d (see FIG. 2) are also formed on the upper surface of the supporting layer 30 for use as a plating line (having a line width about 30 μm and a film thickness about 3 μm, for example) so as to connect the pad portion (having a line width of about 30 μm, for example) of the top surface of the supporting layer 30 and the electrically conductive line 21 (see FIG. 2). In addition, if Al is used instead of Cu, although it is advantageous to reduce the damage during subsequent laser processing, it is required for a syndicate processing as a preliminary treatment of the plating, increasing manufacturing cost.

Figures 3D, 3E, 3I, 3J:
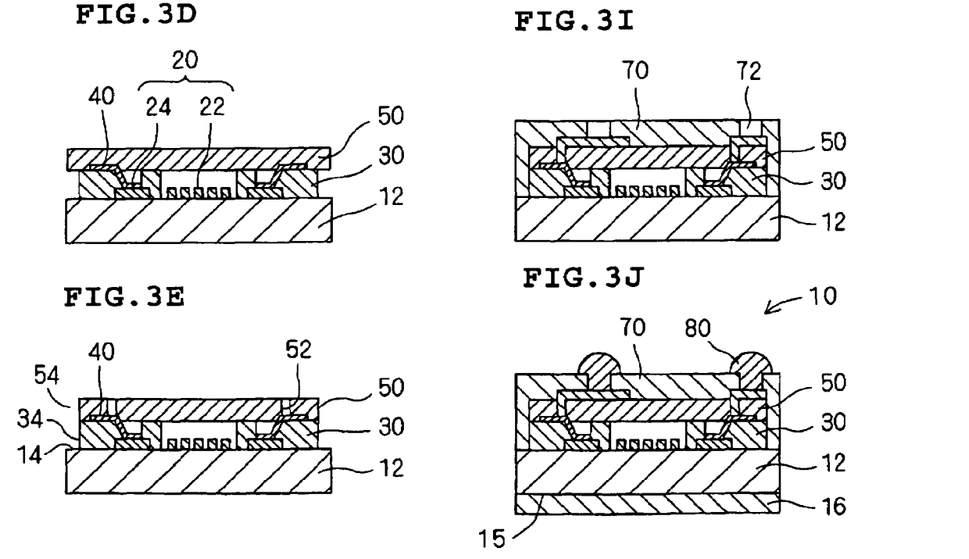

Then, as shown in FIG. 3D, the cover 50 is provided. For example, a sheet made of a polyimide film with a thickness of about 15 μm to about 30 μm coated with a polyimide adhesive is bonded on the entire wafer surface by a roll laminating method, and is cured at about 200° C.

Next, as shown in FIG. 3E, through holes (via holes) 52 are formed in the cover 50 and a groove 54 is formed in the boundary between adjacent surface acoustic wave filters 10 by removing the portion of the cover 50 that protrudes off the peripheral surface 34 of the supporting layer 30. For example, by using a THG (third harmonic generation) laser, a laser processing residue is removed by $O_2$ ashing after the via holes 52 with a diameter of about 10 μm and the groove 54 are formed on the cover 50.

When the THG laser (wavelength: 355 nm) is used, since the laser-light absorption rate of the polyimide film of the cover 50 is about 99% and that of Al of the electrically conductive line 21 and the short lines 25a to 25d is about 10%, when the groove 54 is formed by removing the protruding portion of the cover 50, the electrically conductive line 21 formed on the wafer top surface 14 below the portion cannot be removed by the laser. Even when a SHG (second harmonic generation) laser (wavelength: 532 nm) or a $CO_2$ laser (wavelength: 10.6 μm) is used, as long as laser processing conditions, such as thickening the electrically conductive line 21, are appropriately selected, the groove 54 can be formed between adjacent surface acoustic wave filters 10 after one time cutting.

Since the supporting layers 30 of adjacent surface acoustic wave filters 10 have gaps due to the peripheral surface 34, only the cover 50 can be removed by the laser in a short time. At this time, to have the same energy density (having an equivalent processing speed and processed shape) when the laser beam diameter is enlarged, a large output power is required. Accordingly, the processing speed must be increased by reducing the processing width to as small as possible so as to increase the energy density. That is, it is preferable that the cover 50 after removal extends outside the peripheral surface 34 of the supporting layer 30. Also, the contact area between the cover and the reinforcing material can be increased, improving sealing ability.

Then, as shown in FIG. 3F, the via holes 52 are embedded with a conductive material. For example, the via holes 52 are embedded by Cu electrolytic plating using the electrically conductive line 21 as a power feeding film.

Then, as shown in FIG. 3G, the ground wiring 60 and a hot wiring 65 are formed on the cover 50 for connecting the via holes 52 and the external electrodes 80. For example, the ground wiring 60 and the hot wiring 65 are formed by the lift-off technology. At this time, in view of the easiness of the subsequent plating, Ti with a thickness of about 100 nm, Al with a thickness of about 1 μm, and Cu with a thickness of about 100 nm are formed in that order.

Next, as shown in FIG. 3H, after the wafer top surface 14 of the piezoelectric substrate 12, the supporting layer 30, and the cover 50 are coated with the reinforcing material 70, through holes 72 are formed in the cured reinforcing material 70 so as to expose the ground wiring 60 and the hot wiring 65 as shown in FIG. 3I. For example, an epoxy resin, a silicone resin, a low-temperature glass fritter, a polyimide resin, or an acrylic acid ester resin is applied as the reinforcing material 70 so as to have a thickness on the cover 50 of about 30 μm, after which the through holes 72 are formed with a diameter of about 100 μm. The through holes 72 are preferably formed by lithography when a photosensitive resin is used, and are formed by laser when a non-photosensitive resin is used.

If a halogen gas is generated during the curing of the reinforcing material 70, characteristic deterioration is caused due to the corrosion of the IDT 22 and the piezoelectric substrate 12 and gas adhesion to the surfaces of the elements. It is preferable that a polyimide resin, a benzocyclobutene resin, or a silicone resin is used for the cover 50 and the supporting layer 30, and an epoxy resin or a silicone resin is used for the reinforcing material 70 because halogen gas is not generated. Even with a resin generating the halogen gas, when the reinforcing material 70 is cured in a reduced-pressure atmosphere, the halogen gas can be prevented from entering the vibratory space 26, into which the IDT 22 is sealed, preventing characteristic deterioration.

Then, as shown in FIG. 3J, the external electrodes 80 are formed, which are connected to the ground wiring 60 and the hot wiring 65 via the through holes 72 while a protection resin 16 is provided on the bottom surface 15 of the piezoelectric substrate 12.

Specifically, as a sub-film of the external electrode 80, Ni with a thickness of about 300 nm and Au with a thickness of about 100 nm are sequentially formed by electrolytic plating on portions of the ground wiring 60 and the hot wiring 65 exposed by the through holes 72. Instead of forming the sub-film, the external electrodes 80 themselves may also be electro-plated with Ni and Au by embedding the through holes 72 with Cu electrolytic plating. Then, after the entire wafer bottom surface of the piezoelectric substrate 12 is coated with an epoxy resin with a thickness of about 10 μm, beaded external terminals are formed by printing the solder for external electrodes on portions of the through holes 72 and by reflow-soldering thereon.

Finally, by dicing the wafer of the piezoelectric substrate 12 at the boundary between adjacent surface acoustic wave filters 10, the piezoelectric substrate 12 is divided into each piece of the surface acoustic wave filter 10. At this time, by cutting only the reinforcing material 70, the supporting layer 30 and the cover 50 are prevented from being exposed due to the dicing. However, the cut surfaces of the short lines 25a to 25d (see FIG. 2) are exposed from side surfaces of the divided surface acoustic wave filter 10.

When the surface acoustic wave filter 10 is manufactured as described above, the alignment joining process is eliminated and the cover 50 is made by inexpensive roll lamination, so that the manufacturing cost can be reduced. By using the THG laser, the via holes 52 with a diameter of about 10 μm can be formed so as to miniaturize the elements. Since a photosensitive resin is not used, the degree of freedom of selecting materials is increased for the cover 50 and the reinforcing material 70. The cover 50 and the wirings are covered with the reinforcing material 70 so as not to be exposed to the outside, securing reliability. Since the wiring is formed by plating, the non-defective rate in via conduction is excellent. By combining plating with soldering, the strength of the external electrode 80 is increased. For the reinforcing material 70 and the protection resin 16, the strength against a mounting impact can be secured. Since the supporting layer 30, the cover 50, and the reinforcing material 70 are resins, and due to their buffer effects, defects, such as wire breaking, which are caused by the mounting impact and a thermal impact, are reliably prevented.

Next, a surface acoustic wave filter 10a according to a second preferred embodiment will be described with reference to FIGS. 4A-4J.

According to the second preferred embodiment of the present invention, a part of the manufacturing process is different from the first preferred embodiment, so that cut surfaces of the short lines 25a to 25d (see FIG. 2) are not exposed from the side surfaces of the surface acoustic wave filter 10a. The points that are different from the first preferred embodiment will be mainly described below.

As shown in FIGS. 4A to 4D, after the metallic film 20 is formed on the wafer top surface 14 of the piezoelectric substrate 12, the supporting layer 30 is formed in the same way as in the first preferred embodiment. Then, after the wiring 40 extending from the pads 24 to the top surface of the supporting layer 30 is formed, the wiring 40 is covered with the cover 50.

Figure 4A:
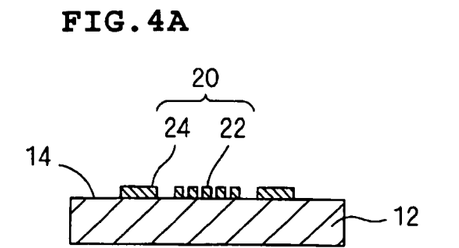
FIGS. 4A to 4J are exemplary views illustrating a manufacturing process of the surface acoustic wave filter according to a second preferred embodiment of the present invention.
Figure 4B:
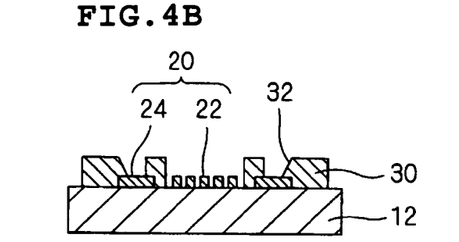
Figure 4C:
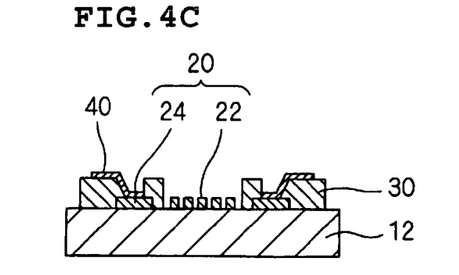
Figure 4D:
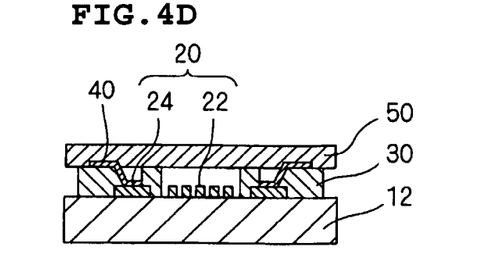
Figure 4E:
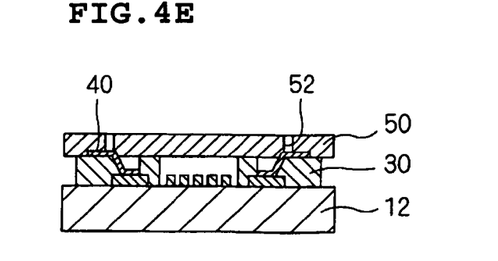

Then, as shown in FIG. 4E, the via holes 52 are formed in the cover 50, and the via holes 52 are embedded with a conductive material. For example, after forming the via holes 52 with a diameter of about 10 μm on the cover 50 using the THG laser, a laser processing residue is removed by $O_2$ ashing. Then, the via holes 52 are embedded by Cu electrolytic plating using the electrically conductive line 21 (see FIG. 2) as a power feeding film.

Figure 4F:
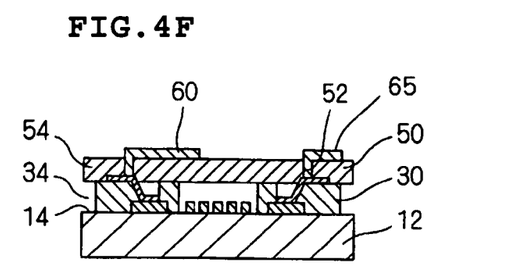

Then, as shown in FIG. 4F, the ground wiring 60 and the hot wiring 65 are formed on the cover for connecting the via holes 52 to the external electrodes 80. For example, the ground wiring 60 and the hot wiring 65 are formed by a lift-off technology. At this time, in view of subsequent plating, Ti with a thickness of about 100 nm, Al with a thickness of about 1 μm, and Cu with a thickness of about 100 nm are sequentially formed, for example.

Figure 4G:
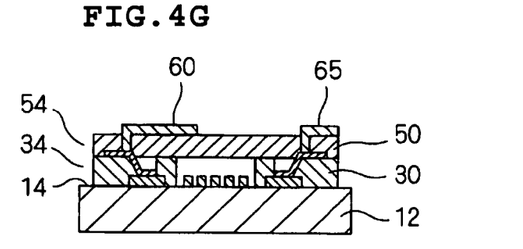

Then, as shown in FIG. 4G, the groove 54 is formed on the cover 50. At this time, the short lines 25a to 25d connecting the electrically conductive line 21 and the pads 24a to 24d are also removed (see FIG. 2). For example, after the processing using the THG laser, a laser processing residue is removed by $O_2$ ashing.

Figure 4H:
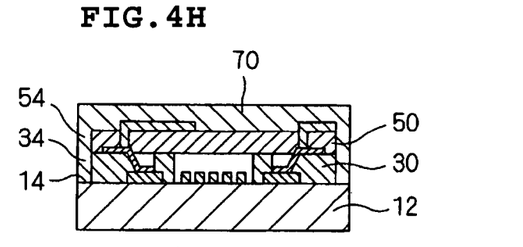
Figure 4I:
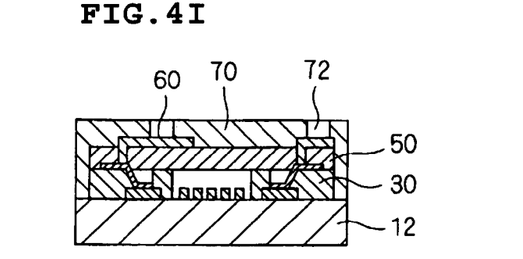

Then, as shown in FIG. 4H, the wafer top surface 14 is coated with the reinforcing material 70 so as to cover the supporting layer 30 and the cover 50 with the reinforcing material 70, and then, as shown in FIG. 4I, the through holes 72 are formed in the cured reinforcing material 70 so as to expose the ground wiring 60 and the hot wiring 65. For example, an epoxy resin, a silicone resin, a polyimide resin, or an acrylic acid ester resin is preferably applied as the reinforcing material 70 so as to have a thickness on the cover 50 of about 30 μm and form the through holes 72 with a diameter of about 100 μm. The through holes 72 are formed by lithography when a photosensitive resin is used, and are formed by laser when a non-photosensitive resin is used.

Figure 4J:
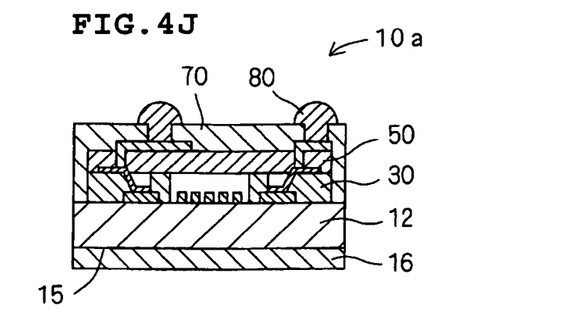

Then, as shown in FIG. 4J, the external electrodes 80 are formed, which are connected to the ground wiring 60 and the hot wiring 65 via the through holes 72 while the protection resin 16 is formed on the bottom surface 15 of the piezoelectric substrate 12.

Specifically, as a sub-film of the external electrode, Ni with a thickness of about 300 nm and Au with a thickness of about 100 nm are sequentially formed on portions of the ground wiring 60 and the hot wiring 65 exposed by the through holes 72 by electroless plating. Instead of forming the sub-film, the external electrodes themselves may also be electroless-plated with Ni and Au by embedding the through holes 72 by electrolytic Cu plating. Then, after the entire wafer bottom surface of the piezoelectric substrate 12 is coated with an epoxy resin with a thickness of about 10 μm, beaded external terminals are formed by printing the solder for external electrodes on portions of the through holes 72 and by reflow-soldering thereon.

Finally, by dicing the wafer of the piezoelectric substrate 12 at the boundary between adjacent surface acoustic wave filters 10a, the piezoelectric substrate 12 is divided into each surface acoustic wave filter 10a. At this time, by cutting only the reinforcing material 70, the supporting layer 30 and the cover 50 are prevented from being exposed due to the dicing.

When the groove 54 is formed on the cover 50, the short lines 25a to 25d (see FIG. 2) are removed and the wirings of the short lines 25a to 25d are not exposed outside the reinforcing material 70, improving the reliability of the surface acoustic wave filter 10a.

In addition, the surface acoustic wave filter 10a according to the second preferred embodiment also achieves the same advantages as those of the surface acoustic wave filter 10 according to the first preferred embodiment.

As described above, by sealing the vibratory space 26 around the IDT 22 with the reinforcing material 70, the surface acoustic wave filters 10 and 10a have greatly improved moisture resistance while being miniaturized, and do not need to be sealed after being mounted on a circuit board.

In addition, the present invention is not limited to the preferred embodiments described above, so that various modifications can be made.

The present invention is not limited to a surface acoustic wave filter, so that piezoelectric devices having elements using surface acoustic waves and piezoelectric devices, such as a bulk surface acoustic wave filter with a substrate having piezoelectric elements formed thereon using piezoelectric thin films, may also by encompassed by the invention.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A piezoelectric device comprising:
    an element substrate including a piezoelectric element and an electrically conductive pattern connected to the piezoelectric element on a principal surface of the element substrate;
    a supporting layer arranged at a periphery of the piezoelectric element on the principal surface of the element substrate;
    a cover covering the supporting layer and arranged to provide a groove inside an external periphery of the element substrate, the groove extending entirely around the external periphery of the element substrate;
    an insulating reinforcing material arranged to entirely cover portions of the element substrate adjacent to the cover and ranging from the cover to the external periphery of the principal surface of the element substrate; and
    an electrically conductive member electrically connected to the electrically conductive pattern so as to pass through the cover and the reinforcing material.

2. The device according to claim 1, wherein the cover extends to an outside peripheral surface of the supporting layer as viewed from a direction normal to the principal surface of the element substrate.

3. The device according to claim 1, wherein the cover or the supporting layer is made of one of a polyimide resin, a benzocyclobutene resin, and a silicone resin and wherein the reinforcing material is one of an epoxy resin or a silicone resin.

* * * * *